(12) United States Patent
Shaw

(10) Patent No.: US 9,261,659 B2
(45) Date of Patent: Feb. 16, 2016

(54) APPARATUS FOR CONCENTRATING SOLAR ENERGY

(71) Applicant: Solar Sure PTY LTD, Armidale, NSW (AU)

(72) Inventor: Ian Henry Shaw, Armidale (AU)

(73) Assignee: Solar Sure Pty Ltd., Armidale NSW (AU)

( * ) Notice: Subject to any disclaimer, the term of this patent is extended or adjusted under 35 U.S.C. 154(b) by 0 days.

(21) Appl. No.: 14/429,382

(22) PCT Filed: Sep. 21, 2013

(86) PCT No.: PCT/AU2013/001081
§ 371 (c)(1),
(2) Date: Mar. 19, 2015

(87) PCT Pub. No.: WO2014/043762
PCT Pub. Date: Mar. 27, 2014

(65) Prior Publication Data
US 2015/0234133 A1    Aug. 20, 2015

(30) Foreign Application Priority Data

Sep. 22, 2012  (AU) ................................ 2012904133

(51) Int. Cl.
*G02B 6/42*  (2006.01)
*H01L 31/05*  (2014.01)
*H01L 31/054*  (2014.01)

(52) U.S. Cl.
CPC ............ *G02B 6/4212* (2013.01); *G02B 6/4203* (2013.01); *H01L 31/0547* (2014.12)

(58) Field of Classification Search
CPC ................................................... G02B 6/48032
USPC .................................................. 385/137, 147
See application file for complete search history.

(56) References Cited

U.S. PATENT DOCUMENTS

2011/0096426 A1   4/2011   Ghosh et al.
2011/0315862 A1   12/2011  Zhou et al.

FOREIGN PATENT DOCUMENTS

WO     2011153320    12/2011

*Primary Examiner* — Akm Enayet Ullah
(74) *Attorney, Agent, or Firm* — Scherrer Patent & Trademark Law, P.C.; Stephen T. Scherrer; Monique A. Morneault

(57) ABSTRACT

A solar concentrator comprising a transparent optical material including a first light coupling portion having an outer end and an inner end tapered so that it converges from the outer end towards the inner end; a first facet formed at the outer end and arranged to reflect light along the first light coupling portion; a first primary concentrator element arranged to focus light onto the first facet; a second light coupling portion having an outer end and an inner end tapered so that it converges from said outer end towards said inner end; a second facet formed at the outer end of the second light coupling portion and arranged to reflect light along said portion the second facet vertically overlapping the first facet; a second primary concentrator element arranged to focus light onto the second facet; a common light guide portion in optical communication with said inner ends of the first and second light coupling portions and arranged to transmit said radiation therethrough; wherein a greatest vertical thickness of the common light guide portion is less than a sum of the heights of the first and second facets.

16 Claims, 12 Drawing Sheets

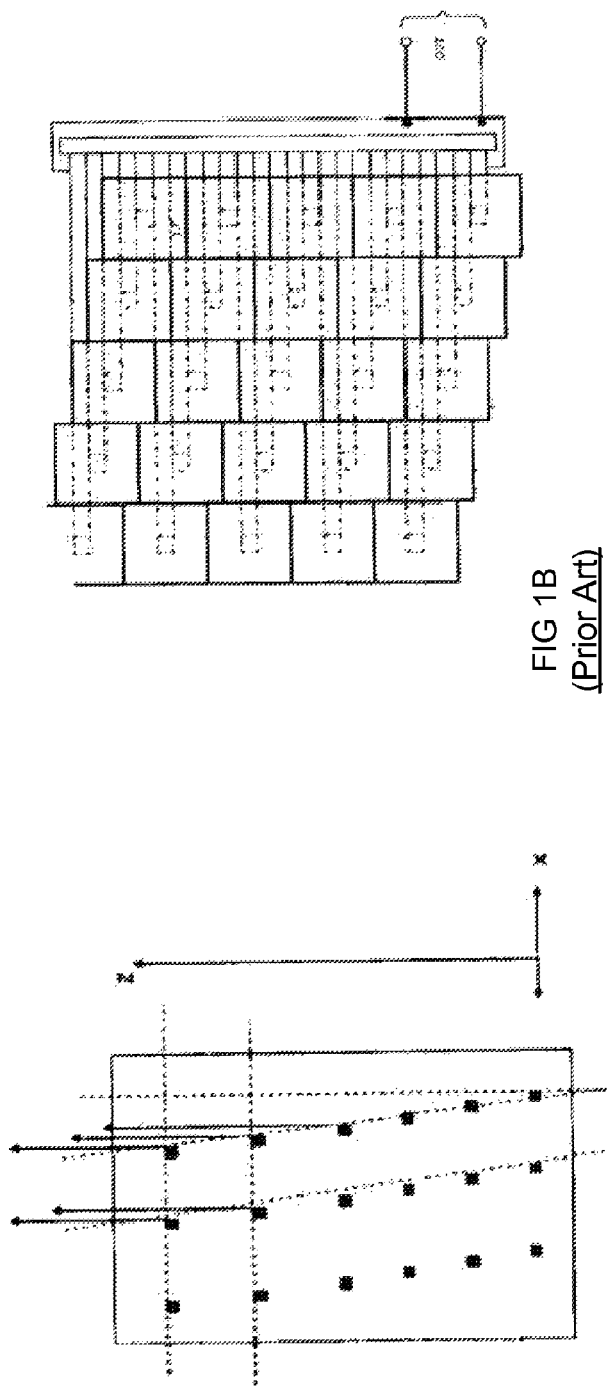
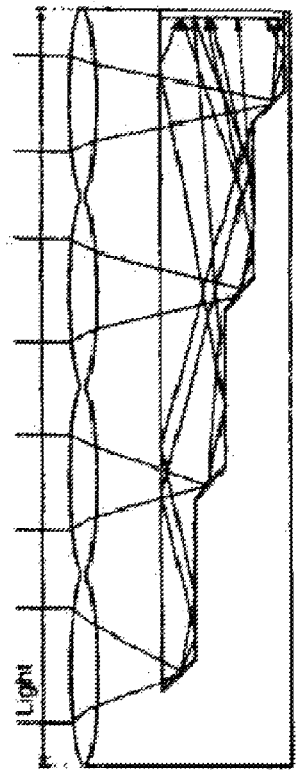
FIG 1B
(Prior Art)
FIG 1C
(Prior Art)
FIG 1A
(Prior Art)

APPARATUS FOR CONCENTRATING SOLAR ENERGY

TECHNICAL FIELD

The present invention relates to apparatus for collecting solar energy and to solar electrical power systems.

BACKGROUND

Any references to methods, apparatus or documents of the prior art are not to be taken as constituting any evidence or admission that they formed, or form part of the common general knowledge.

The most common method of converting solar energy into electricity entails mounting standard photovoltaic modules on rooftops or on ground mounted structures. On average this approach turns sunlight into electricity at well under 20% efficiency.

Multi-junction PV cells are around 150% more efficient than these standard PV cells but they only operate optimally when sunlight is concentrated by lenses, prisms or mirrors and when the arrays are turned to face the sun very accurately by using highly accurate dual-axis tracking machines.

Using such trackers contributes around an additional 30-40% more electricity compared to fixed standard modules so it would be reasonable to expect over 3 times more power using trackers and multi-junction cells in combination. In practice however these gains are rarely realized because most concentrators require a very high level of tracking accuracy which is difficult to achieve. The angle of acceptance required is usually well under +−1.5 degrees and inaccurate tracking, even slightly outside of this small range, causes electrical outputs to virtually shut down. Quality control in the manufacturing of concentrator components is also proving difficult.

There have been a number of concentrators in the prior art in which concentrated light is coupled with a planar light guide after reflecting off vertically or horizontally stepped reflective faces. One design incorporates both horizontally and vertically stepped reflective faces. These devices usually step down or across by the depth or width of the injector element whereby the light guide rapidly increases in depth (where steps are in the vertical plane) or in width (where steps are in the horizontal plane). These arrangements restrict the potential lengths of the arrays, and therefore the area of light capture as well as the potential concentration ratio.

In the case of a horizontally stepped light guide (as depicted in FIGS. 1A and 1B), there are only a limited number of steps, each by the width of one injector element, before the primary concentrator elements in one light guide impinge on the space of concentrator elements of the adjacent light guides. In the case of a vertically stepped light guide (as depicted in FIG. 1C), the increasing depth becomes unmanageably thick as well as costly in terms of the volume of optical material required.

There are also devices that have ramped or tapered coupling elements. Some of these have the tapered elements set close to the bottom of a relatively thick light guide, meaning acceptance angles and/or concentration ratios are not high. Others use a series of tapered coupling elements in the same light stream where inevitably, downstream couplers interfere with light rays from upstream couplers and cause light to be decoupled from the light guide. These designs can cause significant losses of light as it decoupled and exits the system.

It would be advantageous if a device could be provided that addressed the above described problems of the prior art and which could direct concentrated sunlight onto multi-junction cells. It would be desirable that in at least preferred embodiments such a device had a much higher tolerance to tracking inaccuracy. Also it would be advantageous if embodiments of the device had characteristics of superior heat dissipation and uniform scattering of light rays over the entire surface of the cell and which was also suited for fabrication into large modules.

SUMMARY OF THE INVENTION

According to a first aspect of the present invention there is provided a solar concentrator comprising a transparent optical material, said optical material including:

a first light coupling portion having an outer end and an inner end tapered so that it converges from the outer end towards the inner end;

a first facet formed at the outer end and arranged to reflect light along the first light coupling portion;

a first primary concentrator element arranged to focus light onto the first facet;

a second light coupling portion having an outer end and an inner end tapered so that it converges from said outer end towards said inner end;

a second facet formed at the outer end of the second light coupling portion and arranged to reflect light along said portion the second facet vertically overlapping the first facet;

a second primary concentrator element arranged to focus light onto the second facet;

a common light guide portion in optical communication with said inner ends of the first and second light coupling portions and arranged to transmit said radiation therethrough;

wherein a greatest vertical thickness of the common light guide portion is less than a sum of the heights of the first and second facets.

The upper surfaces of the first and second light coupling portions and the common light guide portion may present a planar surface.

In one embodiment of the invention lower surfaces of the first and second light coupling portions and the common light guide portion present a planar surface.

Alternatively the at least one tapered light coupling portion may have an upper face downwardly inclined from proximal an upper edge of the first facet to a lower edge of the second facet.

Preferably the reflective surfaces of the facets are planar though they may be concave.

A layer of low reflective index may be disposed between the first light coupling portion and the second light coupling portion wherein the layer is of sufficiently low refractive index compared to material of each of said coupling portions to support total internal reflection of light from the facets thereof within said coupling portions.

The layer may comprise an air gap for example.

Preferably the first light coupling portion and the second light coupling portion are vertically separate by the layer of low refractive index.

In an embodiment of the invention the first light coupling portion is located lower than the second light coupling portion and facets of the first light coupling portion extend laterally outward beneath the second light coupling portion.

According to a further aspect of the present invention there is provided a solar concentrator assembly having an outer end and an inner receiving end and comprising a plurality of solar concentrators of the previously described type, wherein adjacent solar concentrators are, offset laterally and longitudinally from each other and wherein facets of each of the said solar concentrators are in optical communication with the receiving end.

The respective primary concentrator elements for each of the facets may describe a parallelogram configuration.

Alternatively the respective primary concentrators for each of the facets may describe square or rectangular configurations.

The primary concentrators may be grouped into a number of rectangular arrays wherein each said array is offset from an adjacent array.

According to a further aspect of the present invention there is provided a solar concentrator assembly comprising first and second columns of solar concentrators as previously described, wherein ends of common light guide portions of the solar concentrators of the first column are located opposite ends of common light guide portions of the solar concentrators of the second column.

According to a further aspect of the present invention there is described an apparatus for concentrating sunlight comprising:

a first primary concentrator element focusing sunlight into a transparent optical material with a refractive index greater than n1.5 and onto a point on a first reflective facet, a second primary concentrator element, adjacent to and adjoining the first, focusing sunlight through at least one surface of said optical material and onto a point on a second reflective facet the two reflective facets being at different elevations, light rays from the two reflective facets transmitted in the same general direction, perpendicular to the sun's rays, via a corresponding coupling element, with one or both of the coupling elements being vertically tapered, all rays from the first coupling element being manipulated, (by way of precise geometry), to pass the second coupling element without interactions or interference that would result in subsequent decoupling, the two reflective facets with their corresponding coupling elements together constituting a dual-element coupler, all faces within (of) the dual element coupler having a particular shape, slope and length optimized for a desired concentration ratio, array profile and angular acceptance, all rays along the full length of the dual element coupler being confined horizontally (in a channel) by approximately parallel side walls, which are separated by a distance approximately the width of the reflective facets, all rays subsequently injected into a planar light guide, and transmitted to a receiving edge of that light guide by Total Internal Reflection, the vertical thickness of the planar light guide being significantly less than the sum of the heights of the two reflective facets and optimally being equal, to or less than the height of the first reflective facet.

Preferably the primary concentrator elements are: convex lenses or Plano convex lenses or Fresnel lenses or parabolic reflectors or other point focusing concentrators.

The upper surface of the optical material receiving the concentrated light may be substantially planar and both coupling elements are vertically tapered with their lower faces being upwardly inclined from approximately the bottom edges of the corresponding reflective facets, the second reflective facet extending downwardly from the highest edge of the inclined face of the first coupling element Preferably the lower surface of the optical material receiving the concentrated light is substantially planar, both the coupling elements are vertically tapered with their upper faces being downwardly inclined from approximately the upper edge of each of the corresponding reflective facets, the second reflective facet extending upwardly (and distally) from the lowest edge of the downwardly inclined face of the first coupling element.

In one embodiment neither the top surface nor the bottom surface is planar and wherein at least one of the top faces and at least one of the bottom faces of the two coupling elements is not horizontal.

Additional dual element couplers may be added in the horizontal plane distally away from the receiving edge with each additional dual element coupler longitudinally offset from the preceding one, their associated channels forming a terraced pattern (viewed from top), light rays from each of the dual element couplers being confined horizontally within said channels by side walls, until they enter a planar region of the light guide where they may mix with rays from other dual element couplers, each channel being laterally separated from the adjacent planar region of the light guide by an air gap or film of low RI material preventing rays from the dual element couplers and the planar light guide from mixing until all rays have passed the tapered part of the second coupling element, wherein the area of the said planar light guide generally expands horizontally toward the receiving edge, the area of light capture increasing proportionally to the number of channels but being limited when laterally adjacent primary concentrator elements begin to impinge on each others space.

Repetitions of these light guides may be added laterally, the adjacent planar light guides laterally separated from one another by an air space or low RI material, increasing the array area proportionally to the number of lateral light guide additions.

A second pair of primary concentrator elements may be positioned adjacent to, and adjoining, the first pair (towards the receiving edge) and a corresponding second dual element coupler is positioned under the light guide described in claim 3 where said light guide first becomes planar, making this a second/lower light guide layer, the two light guide layers being separated from each other by an air gap or a low Reflective Index film, such that the focused light from the second pair of concentrator elements passes down through the planar part of the upper light guide, registers with the corresponding reflective facets and is transmitted to the receiving edge of the lower light guide, the combined depth of the two light guide layers being significantly less than twice the height of the first reflective facet and optimally equal to or less than said height.

A second pair of primary concentrator elements may be positioned adjacent to, and adjoining, the first pair of primary concentrator elements and a corresponding second dual element coupler is positioned above the previously described light guide where said light guide first becomes planar, the lower light guide layer being separated from the upper one by an air gap or low Reflective Index film or double sided mirror, such that light focused by the second pair of concentrator elements registers with the corresponding reflective facets in the upper light guide layer and is transmitted to the receiving edge of the upper light guide, the combined depth of the two light guide layers being optimally approximately twice the height of the first reflective facet.

More than two vertical light guide layers may be incorporated in the same array creating an array with multiple light guide layers.

Several double or multiple layered light guides may be positioned side by side forming a grid patterned first array, and an identical, but mirror reverse, array is placed oppositely, propagating light in the opposite direction to the first, all receiving cells being in alignment centrally, effectively doubling the area of light capture.

The double or multiple light guide layers may become fused into the one planar light guide just downstream from the last dual light coupler, the resulting planar light guide having a depth which is a function approximately of the number of light guide layers multiplied by the height of the first reflective facet.

Additional double or multi layered sets of dual element couplers may be added in the horizontal plane distally away from the receiving edge with each additional channel of dual element couplers longitudinally offset from the preceding one, their associated channels forming a terraced pattern when viewed from top, the light guide layers becoming fused into one planar light guide immediately downstream of the last coupling prism of each channel, said planar light guide generally expanding horizontally in the direction of the receiving edge, the number of adjacent channels limited as laterally adjacent primary concentrator elements impinge on one another.

In one embodiment repetitions of these light guides are added laterally, the adjacent planar light guides separated from one another by an air gap or low RI material, increasing the array area proportionally to the number of lateral light guide additions.

A dual element coupler may be provided as previously defined wherein rays from the first coupling element enter a short planar light guide, passing under or over the second coupling element and vertically separated by an air gap or low RI material, all rays subsequently entering a common light guide and allowed to mix before they strike the receiving edge.

In one embodiment an array of like proportions, but in mirror reverse, is placed opposite the first array with the general light propagation direction being opposite that of the first array with all rays converging on a line of centrally aligned receiving cells, effectively doubling the area of light capture.

Preferably the widths of the reflective elements are increased horizontally with one of the side walls of the guiding channel being slightly horizontally tapered from the end of the second reflective facet to further increase the angular acceptance along one axis.

Multi-junction PV cells are preferably positioned on the receiving edge of the light guide to generate electrical power.

Heat harvesting means may be coupled to the receiving edge of the light guide to harvest thermal energy therefrom.

Multi junction cells and heat harvesting means may be positioned on the receiving edge so that both electrical and thermal energy are harvested.

BRIEF DESCRIPTION OF THE DRAWINGS

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way. The Detailed Description will make reference to a number of drawings as follows:

FIG. 1A depicts a prior art, horizontally stepped, light guide.

FIG. 1B is a top view of a prior art, horizontally stepped, light guide.

FIG. 1C is a top view of a prior art, vertically stepped, light guide.

DETAILED DESCRIPTION OF PREFERRED EMBODIMENTS OF THE INVENTION

Figure 1D:
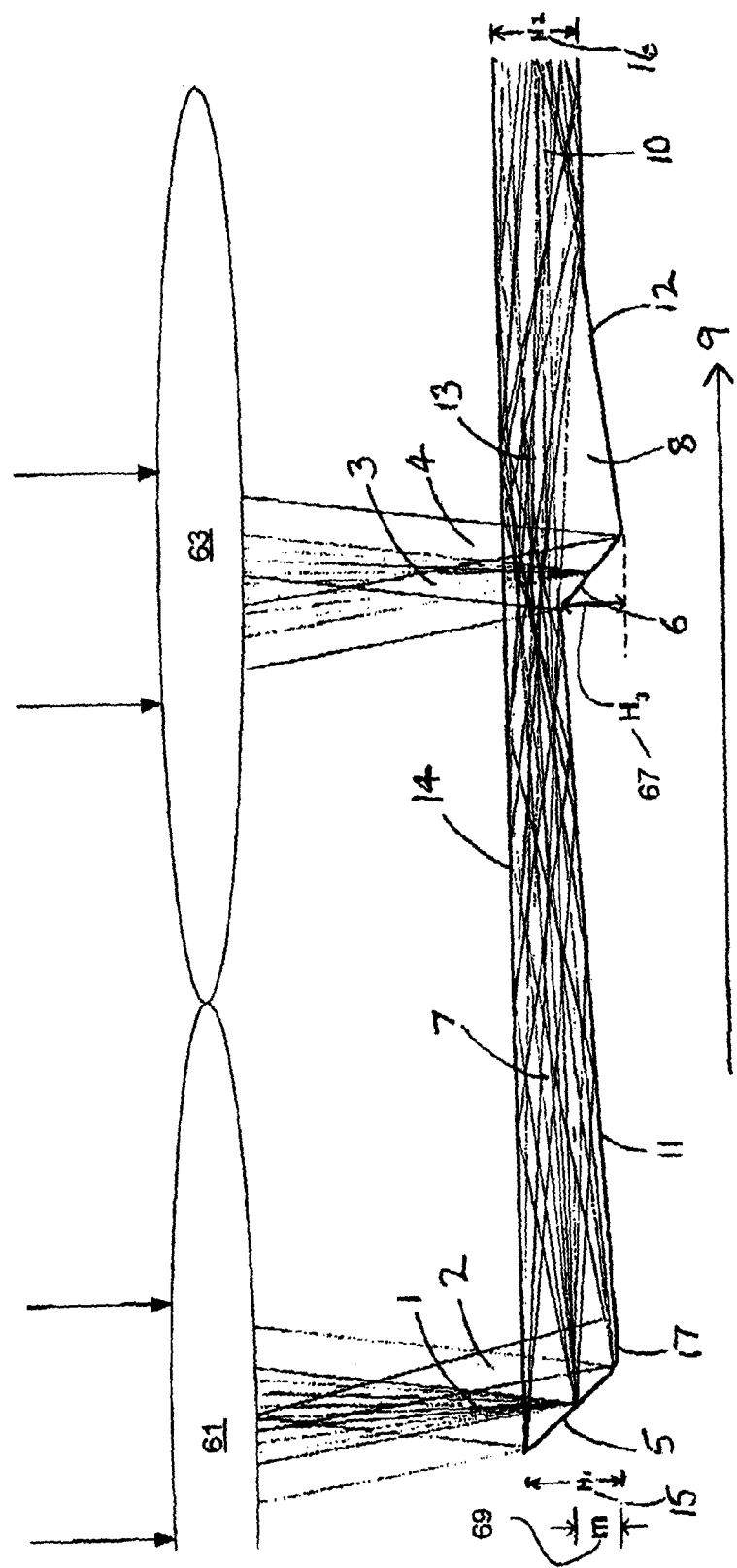
FIG. 1D is a profile of an exemplary dual-element coupler according to a preferred embodiment of the invention.

Referring now to FIG. 1, there, is shown a side view of a dual element light coupler or "light guide", being an apparatus for concentrating light according to a preferred embodiment of the present invention. In FIG. 1 the variously identified components are as follows:

1 first light cone from first primary concentrator element
2 first light cone when array is off-axis
3 second light cone from second primary concentrator element
4 second light cone when array is off-axis
5 first reflective facet. Planar or concave. Polished or mirrored surface.
6 second reflective facet,
7 first tapered coupling element—comprising a first light coupling portion
8 second tapered coupling element—comprising a second light coupling portion
9 general direction of light transmission
10 planar region of the light guide—comprising a common light guide portion
11 upwardly inclined lower face of first coupling element
12 upwardly inclined lower face of second coupling element
13 all rays from first coupling element bypassing second coupling element without loss and then coupling into the planar part of the light guide
14 planar upper surface
15 H1 the vertical depth of the first reflective facet
16 H2 the depth of the planar region of the light guide. Where H2 is optimally, but not necessarily, approximately the same as H1
61 first light concentrating element
63 second light concentrating element 67 H3 is the vertical depth of the second reflective facet.

69 "m" is the vertical overlap of the vertical depths (i.e. "heights") of the first and second facets.

The light coupler of FIG. 1 features a pair of adjoining lenses which focus sunlight into an optical material with a high Refractive Index and onto a pair of reflective facets.

With reference to FIG. 1, there is shown two connected tapered light coupling elements 7, 8 which Inject light rays from primary concentrator elements into a common planar light guide 10. Light rays are transmitted within the light guide by Total Internal Reflection (TIR). All rays from first coupling element 7 passing over second coupling element 9 without interacting with either of the angled faces within it. The depth H2 of the planar region of the light guide is approximately the vertical height H1 of the first reflective element and in any case is less than the sum of the heights (i.e. the "depths") of the first and second facets, i.e. H2<H1+H3. It will be noted that the heights of the first and second facets H1 and H3 overlap vertically a distance m. The overlapping of the facets assists in making the concentrator compact. Furthermore, the tapering of the first and second coupling elements 7, 8 from being deeper at their outer ends and converging towards the common planar region 10 means that the facets 5 and 6 can have longer outer angled faces so that the angle of acceptance for the off axis rays 2 and 4 is greater than it would otherwise be.

Figure 2:
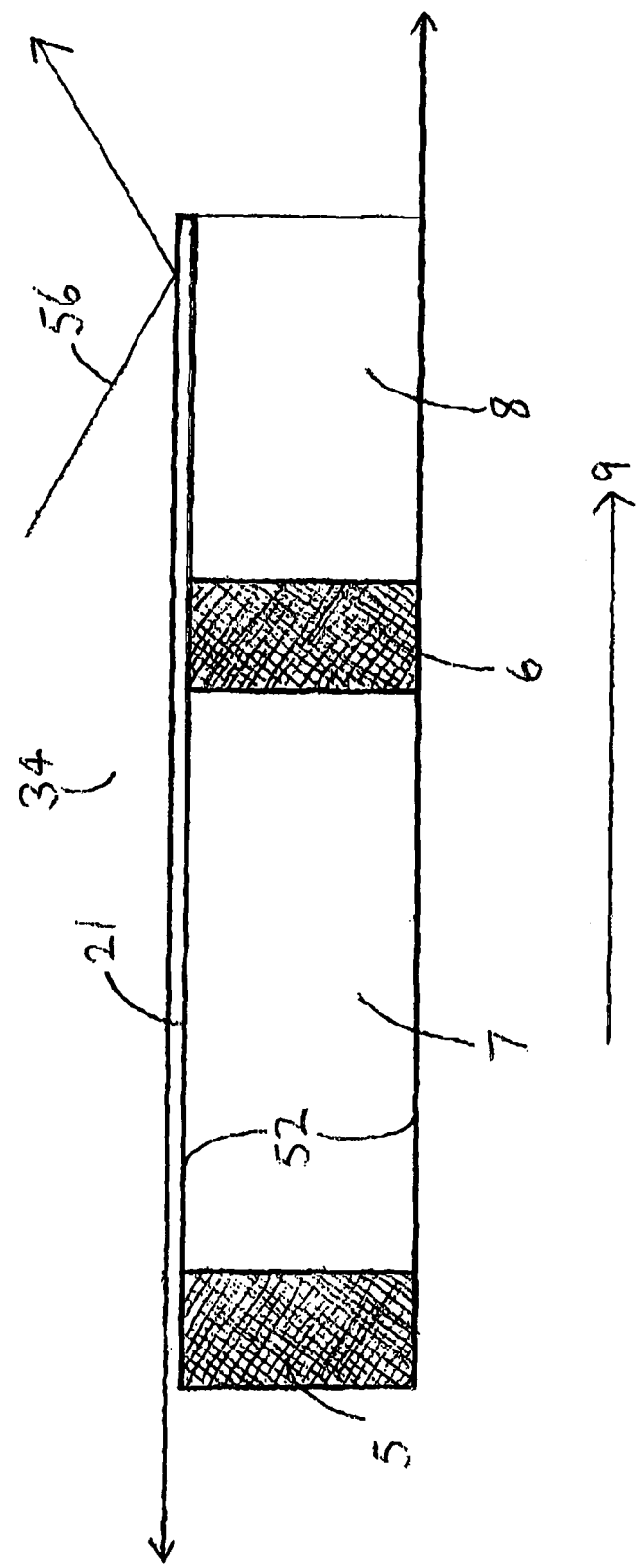
FIG. 2 is a top view of a dual-element coupler according to a further embodiment of the invention.

FIG. 2 is a top view of the dual-element coupler of FIG. 1, with parallel side walls, one of which separates the coupling channel from the adjacent planar light guide. In FIG. 2 the variously identified components are as follows:

5 first reflective facet. Planar or concave. Polished or mirrored surface.
6 second reflective facet.
7 first tapered coupling element
8 second tapered coupling element
9 General direction of light transmission
21 Air gap or low Reflective Index layer.
34 Adjoining planar light guide
52 side walls of dual element coupler
56 deflected ray All rays from the light guide, are prevented from striking the tapered faces of the coupler. Reflective facets 5, 6 being wider "w" than they are long "l" are provided to give a wide range of angular acceptance along the inclination axis.

Figure 3:
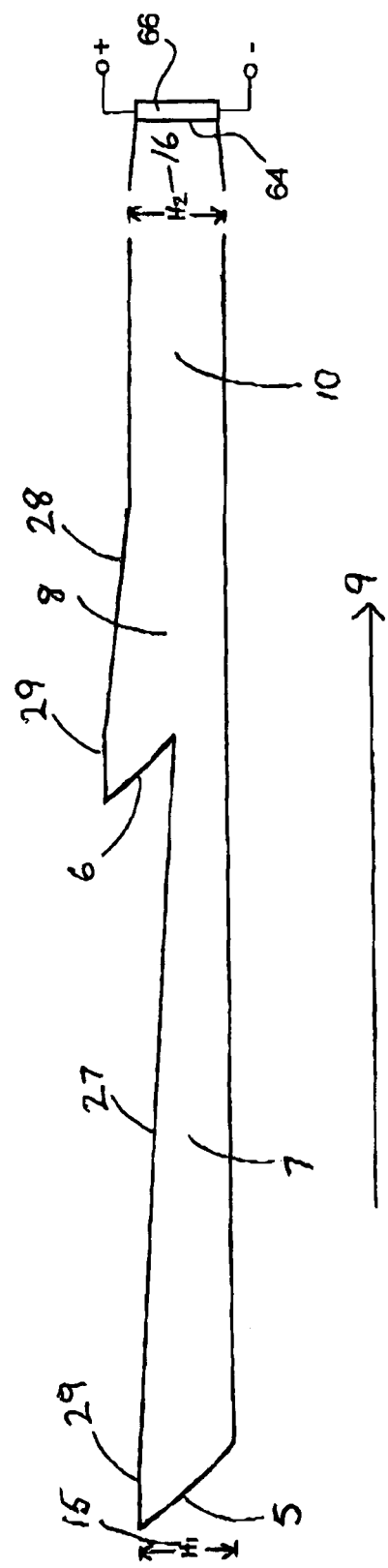
FIG. 3 is a profile of a dual-element coupler according to according to a further embodiment of the invention.

A further embodiment is illustrated in FIG. 3. In FIG. 3 the variously identified components are as follows:

5 first reflective facet. Planar or concave. Polished or mirrored surface.
6 second reflective facet.
7 first tapered coupling element
8 second tapered coupling element
9 General direction of light transmission
10 Planar region of the light guide
15 H1. the vertical depth of the first reflective facet
27 downwardly inclined face of first coupling element
28 downwardly inclined face of second coupling element
29 short horizontal face between reflective element and inclined face of coupling element
65 planar lower surface
66 thin edge of light guide
66 photovoltaic cell.

FIG. 3 is a profile showing a dual-element coupler where the lower surface 65 is planar. There may be an approximately horizontal face 29 between the top edge of the reflective facet and the downwardly inclined face of one or both of the coupling elements.

The concentrated rays are deflected in the same general direction, perpendicular to the incoming sun' rays via two associated vertically tapered coupling elements and into a planar light guide. Rays are transmitted along the light guide by TIR and may be squeezed both horizontally and vertically before striking a thin edge of the light guide on which multi junction PV cells are located. The dimensions, shapes and slopes of the reflectors and the tapered coupling elements are selected to suit the desired concentration ratio, f-number of the lenses and angle of acceptance.

The two reflective facets each with their two coupling elements together constitute a "dual-element coupler"

Compared to existing light guide coupling elements the reflective facets of this device present a large receiving area to the light cones above. By way of the precise geometry of all faces within the dual-element coupler, light from the first coupling element is manipulated to pass over or under the second tapered element with negligible interactions (reflections or shadowing or decoupling). The positioning of the two reflective facets at different elevations within the dual-element coupler is a critical aspect of the design.

Light rays moving along the dual-element coupler are confined horizontally to a channel which has parallel side walls extending the length of the dual-element coupler. This is necessary as, when a multitude of dual element couplers is used in combination, forming a 2-D array, rays from other dual element couplers are prevented from striking a sloping face which could result in those rays exceeding the Critical Angle and being decoupled.

Importantly, the vertical thickness of the planar light guide is not significantly greater than the heights of either of the two reflecting facets (FIGS. 1 & 3). This allows for a thin light guide profile and assists subsequent horizontal concentration. This has significant cost advantages and also allows lens sizes to be kept in like proportions.

Figure 4:
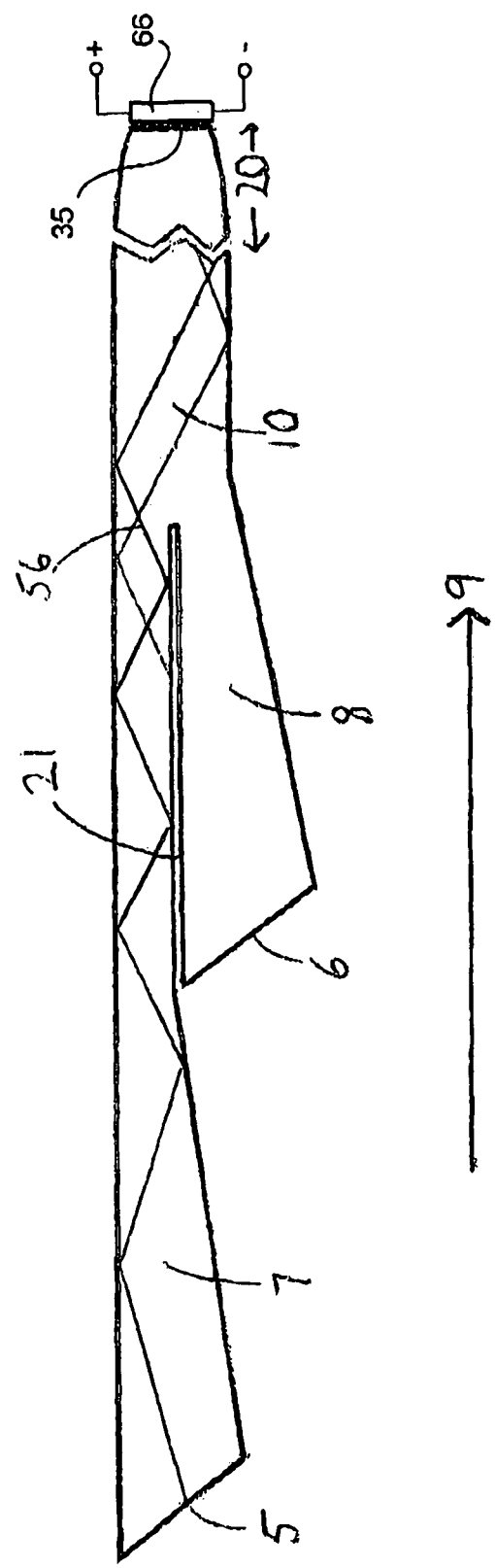
FIG. 4 is a profile of a dual-element coupler according to another embodiment of the invention.

FIG. 4 is a profile of a dual-element coupler according to a further embodiment of the invention. In FIG. 4 the variously identified components are as follows:

5 first reflective facet. Planar or concave. Polished or mirrored surface.
6 second reflective facet.
7 first tapered coupling element
8 second tapered coupling element
9 General direction of light transmission
10 Planar region of the light guide
20 Zone of horizontal concentration near end of planar light guide.
21 Air gap or low Reflective Index layer.
35 receiving edge of light guide
56 deflected ray In this embodiment rays from the first coupling element enter a short planar light guide, passing over the second coupling element due to vertical separation and unable to mix with rays from said second coupling element due to the gap 21. All the rays subsequently enter a common light guide where they mix before they strike the receiving edge.

Figure 5:
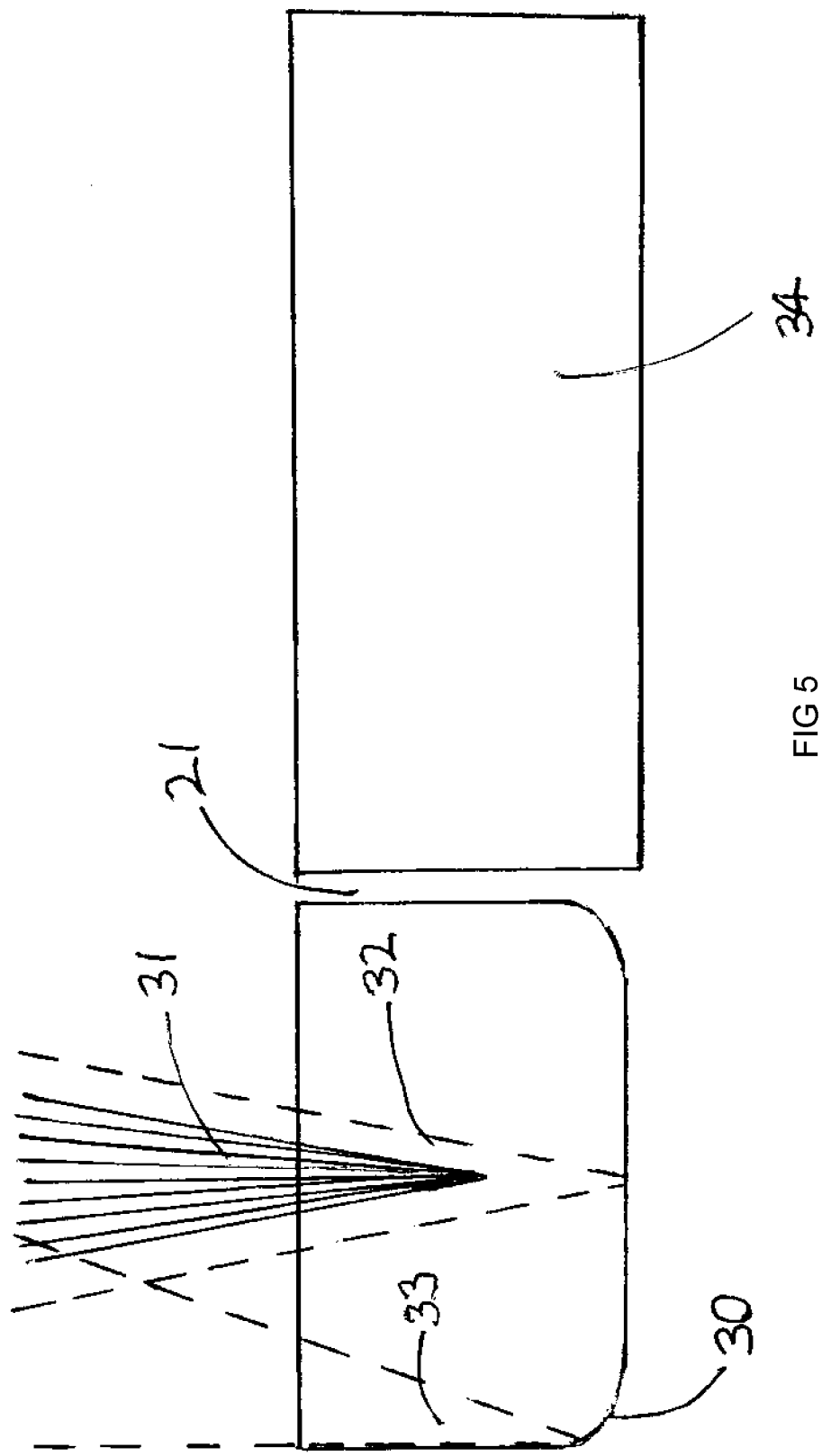
FIG. 5 is a transverse section through a reflective facet and adjoining planar light guide according to a further embodiment of the invention.

FIG. 5 is a transverse section through a reflective facet which is concave in this embodiment, and adjacent a planar light guide. In FIG. 5 the variously identified components are as follows:

21 Air gap or low Reflective Index layer.
30 Concave reflective facet
31 Light cone on-axis
32 Light cone off-axis (inclination)
33 Light cone off-axis (declination)
34 Adjoining planar light guide The width of the reflective facet may be greater than its depth allowing a greater angular acceptance in the inclination axis than the declination axis. The width of the adjacent planar light guide increases as it approaches the receiving edge.

There are several ways in which the previously described dual-element couplers can be incorporated in a solar array with sufficient area to produce a highly productive module.

The preferred embodiment involves having a single light guide layer with multiple channels of dual-element couplers incorporated horizontally, but longitudinally offset from one another, presenting a terraced pattern when viewed from above. All light from this series of channels couples into a common planar light guide. This means the length of the light guide can be increased to at least double that of other light guides where just single injection elements are stepped horizontally. Repetitions of such light guides arranged laterally can create a large area array as shown in FIG. 6.

Figure 6:
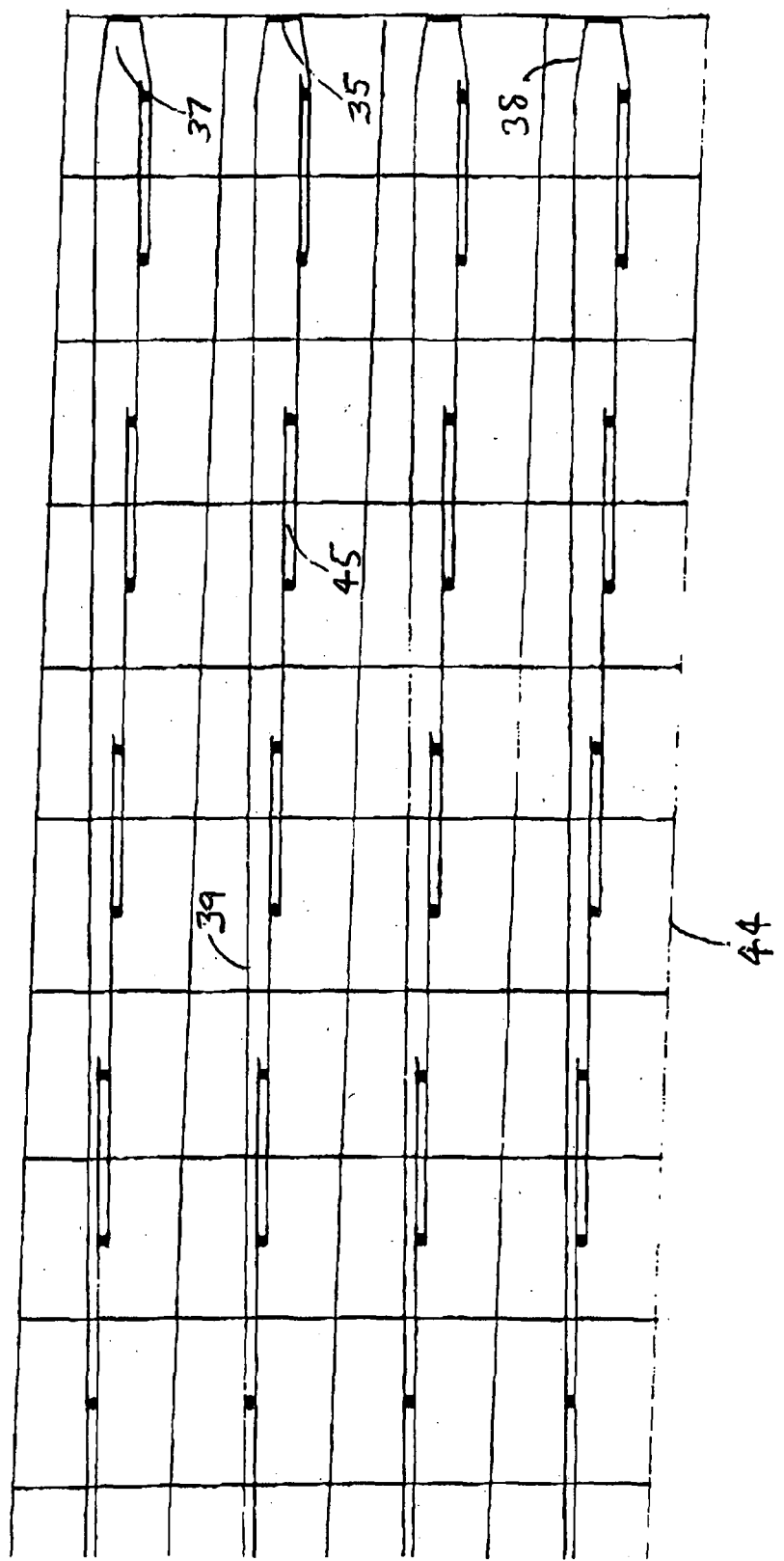
FIG. 6 is a top view of a fight coupling assembly according to a further embodiment of the invention in which there is shown a terraced pattern on a single layer array with parallelogram shaped lenses.

FIG. 6 is a top view showing a terraced pattern on a single layer array where propagation channels, each with their dual-element coupler, longitudinally offset from consecutive propagating channels but where rays from each channel combining as the light guide becomes planar. Lateral repetitions of such light guides separated by spaces or a low RI material and forming a larger area array In FIG. 8 the variously identified components are as follows:
  35 receiving edge of light guide
  37 horizontally squeezed (concentrated) light guide
  38 tapered side wall of light guide
  39 side wall of light guide
  44 Parallelogram lens shape
  45 channel with side walls (a detailed view is shown in FIG. 2) confining light rays until light is coupled to the planar light guide The embodiment of FIG. 6 provides a substantial advantage over the prior art as it allows modules of over twice the area with the same low profile which, in turn, more than doubles the possible concentration ratio. Alternatively, for comparable module areas and concentration ratios, modules with the described offset dual-element couplers have much higher angular acceptance.

Angular acceptance is the quality with the most commercial value as many of the High Concentration PV systems (HCPV) recently deployed are failing due to inability of tracking machines to track accurately enough.

Figure 7:
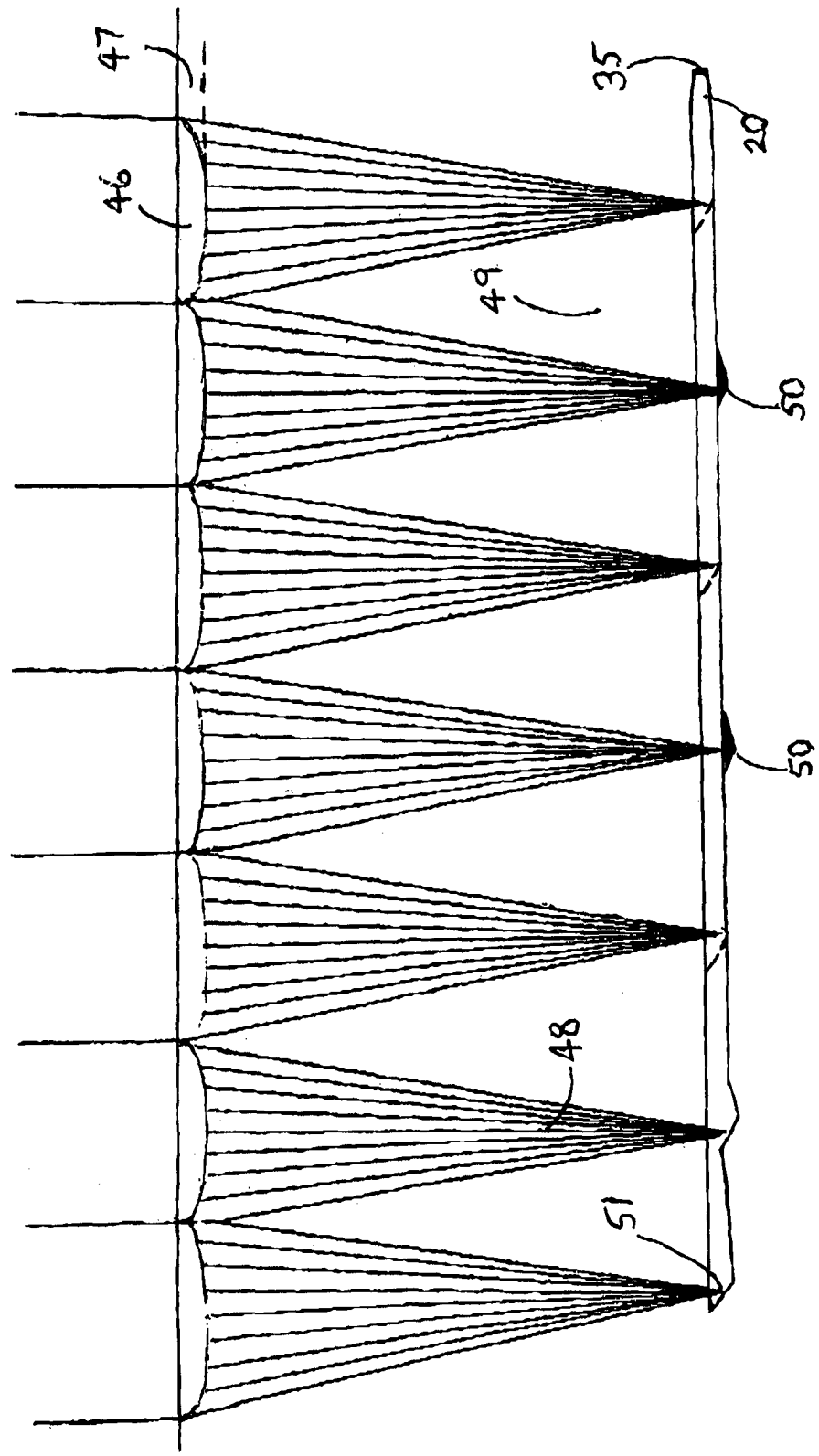
FIG. 7 is a profile of a module according to a further embodiment of the invention with single layer light guide showing primary concentrator lens layer.

FIG. 7 is a profile view of the module of FIG. 6 showing primary concentrator layer with lenses focusing light into a single layer light guide where three sets of dual-element couplers are aligned in the offset manner. Vertical tapering toward the end of the planar light guide.

In FIG. 7 the variously identified components are as follows:
  20 Zone of horizontal concentration near end of planar light guide.
  35 receiving edge of light guide
  48 concentrator element. Convex lens or plano convex lens or Fresnel lens or parabolic reflective concentrator or similar point focusing concentrator
  47 layer of primary concentrator elements
  48 Light cone
  49 air gap or layer of low RI transparent material
  50 second coupling element of offset dual couplers
  51 focus point of light cone Referring now to FIG. 8, there is shown a profile of a further embodiment of the invention showing a second light guide layer positioned under, and downstream from, the first.

Figure 8:
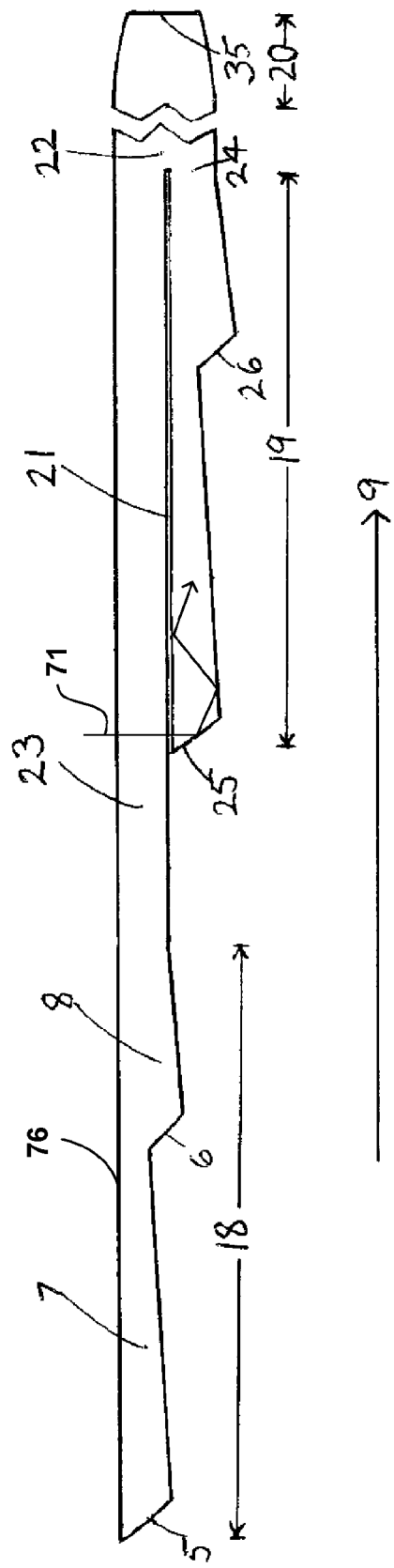
FIG. 8 is a profile of two light guide layers according to a further embodiment of the invention.

In FIG. 8 the variously Identified components are as follows:
  5 first reflective facet. Planar or concave. Polished or mirrored surface.
  6 second reflective facet.
  7 first tapered coupling element
  8 second tapered coupling element
  9 General direction of light transmission
  18 First dual element coupler of upper light guide
  19 Dual-element coupler of lower light guide
  20 Zone of horizontal concentration near end of planar light guide.
  21 Air gap or low Reflective Index layer.
  22 Fused region of planar light guide.
  23 planar region of upper light guide
  24 planar region of lower light guide
  25 first reflective facet of lower light guide
  26 second reflective facet of lower light guide
  35 receiving edge of light guide.
  71 light ray
  76 planar upper surface.

The embodiment of FIG. 8 includes a planar upper surface 76. Vertical concentration towards the receiving edge. Each of the light guide layers are separated by an air gap or low RI film. The two light guide layers fusing to form one guide of double the depth.

In the embodiment of FIG. 8 a second dual-element coupler is positioned under and in the same directional stream as the first dual element coupler in such a way that light from above (represented by ray 71) can pass through the planar part of upper light guide and strike the reflective facets of the lower one. This means a row of four lenses and two dual-element couplers injects light rays along a narrow channel (when viewed from above). Such a row could inject concentrated light into a narrow light guide or, multiple rows of four coupling elements could be lined up side by side to create a matrix of couplers such that light from a rectangular area could all be directed to the receiving side of the light guide and further concentrated, before striking the solar cells.

Figure 9:
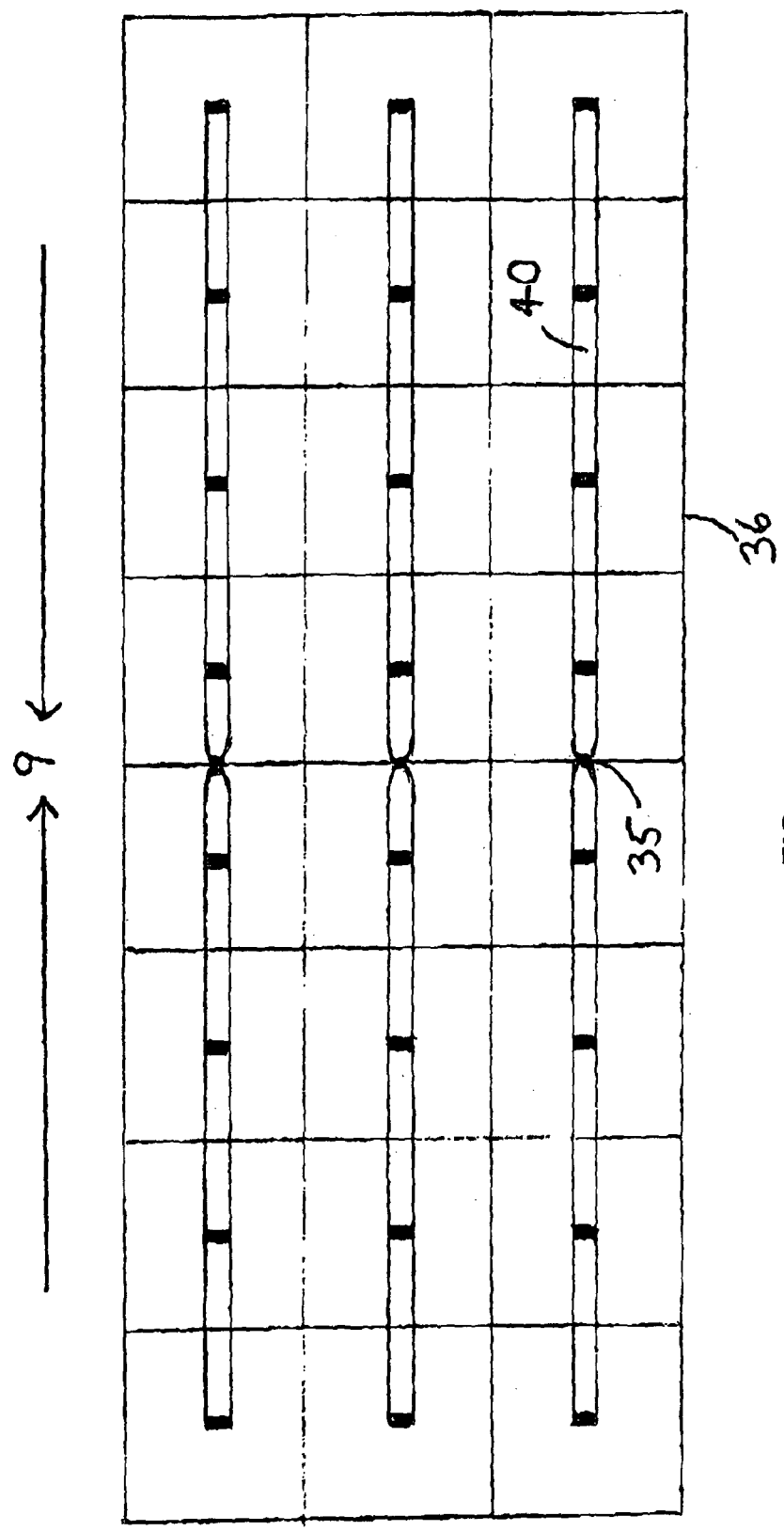
FIG. 9 is a top view showing a matrix according to an embodiment of the invention of side by side rows of coupling elements from two light guide layers collecting light from a first area and a second opposite area.

In this device, the lenses above the coupling elements are aligned with each other both laterally and in the direction of the propagated light, creating a grid pattern for an area defined by the four aligned lenses by as many lenses sideways as desired, potentially hundreds as shown in FIG. 9.

FIG. 9 is a top view showing a matrix, i.e. an assembly, of side by side rows of coupling elements from two light guide layers collecting light from a first area and a second opposite area. All light rays striking receiving cells aligned centrally.

In FIG. 9 the variously identified components are as follows:
  9 General direction of light transmission
  35 receiving edge of light guide
  36 square or rectangular shaped primary concentrator element
  40 four reflective facets in same alignment Alternatively the second dual-element coupler could be positioned downstream but above the planar region of the, first one for a similar result to the one outlined above but in this case the bottom surface of the array is flat.

Figure 10:
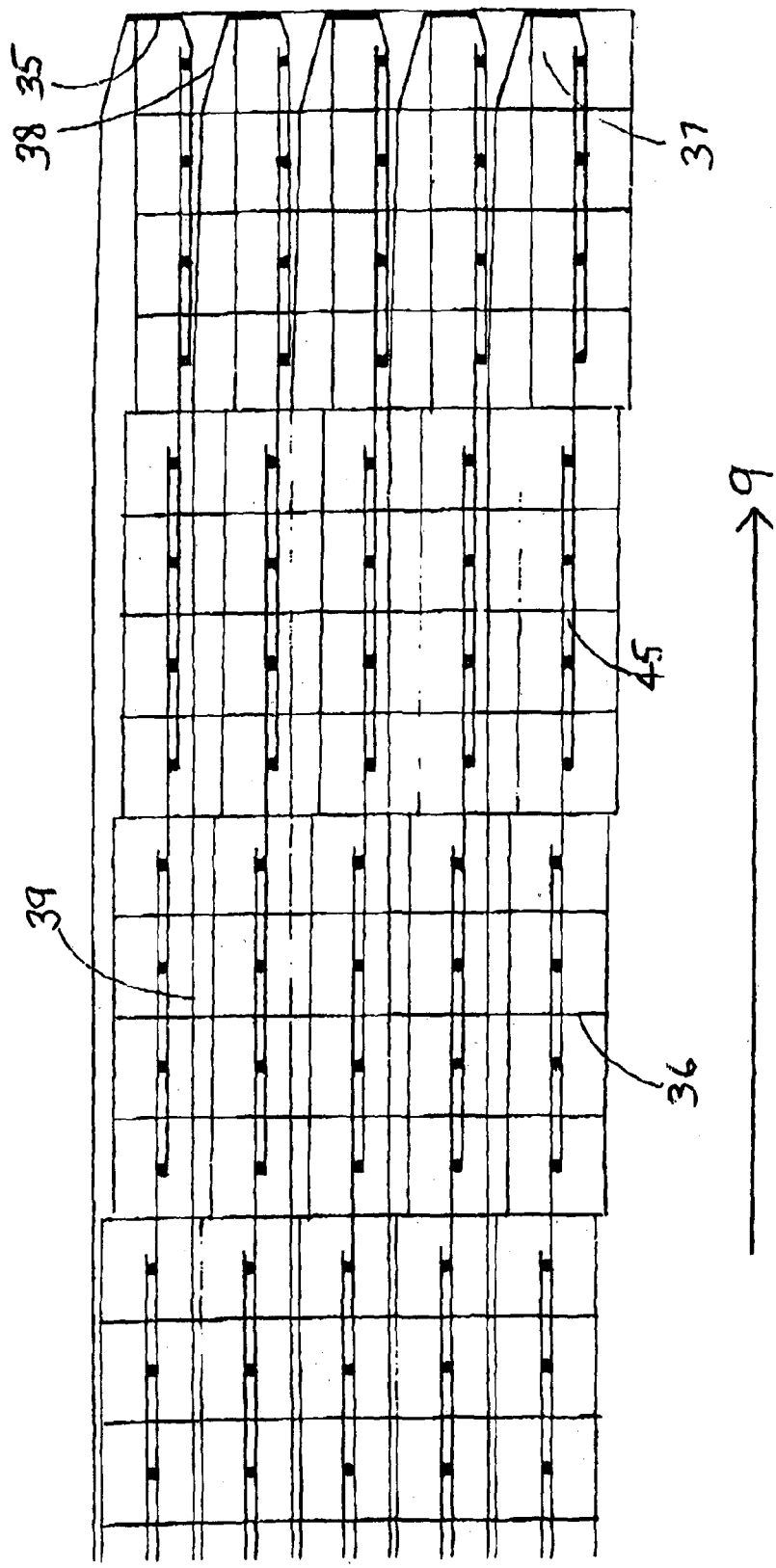
FIG. 10 is a top view of a double layered array with longitudinally offset dual-element couplers according to a further embodiment of the invention.

As for the single layer array these double layered arrays may have the channels of dual-element couplers longitudinally offset from the preceding rows with all light directed into a common planar light guide. Then repetitions of such light guides can be arranged laterally to create a large area array as shown in FIG. 10. In FIG. 10 the variously identified components are as follows 9 General direction of light transmission 35 receiving edge of light guide 36 square or rectangular shaped primary concentrator element 37 horizontally squeezed (concentrated) light guide 38 tapered side wall of light guide 39 side wall of light guide 45 channel with side walls confining light rays until light couples to planar light guide.

FIG. 10 is a top view of a double layered array with longitudinally offset dual-element couplers. Long channels are provided incorporating four reflective facets (two dual-element couplers) which inject rays into horizontally expanding planar light guides. Additional adjacent planar light guides are provided for increasing the array area. Horizontal squeezing of light approaching the receiving edge.

The arrangement illustrated in FIG. 10 is most preferred in terms of concentration ratio, angle of acceptance and module size but is more challenging to fabricate.

Another embodiment has additional repetitions of light guides underneath the others, each with their own dual light couplers making a multi layered array. The sizes of the primary concentrators (suitably plano convex, convex or Fresnel lenses) may be increased appropriately as the number of light guide layers grows.

In all double or multi layered versions the lower light guide is separated from the upper one by an air gap or layer of low refractive index (RI) material. Light guide layers can fuse together immediately downstream from the last coupling element of each guiding channel or closer to the receiving edge, depending on manufacturing preferences.

In versions where multi-junction PV cells are used, said cells will have a thin, laterally stretched, rectangular profile with spaces between the cells. This may allow an opposing array of collectors to direct light in the opposite direction from a second area so that there is a line of rectangular receiving cells extending as long as desired with the opposite array doubling the area, as illustrated in FIG. 9. Heat dissipation is also enhanced with long, narrow receiver cells compared to point focus concentrators.

Alternatively, or additionally, the receiving edge could incorporate heat harvesting means so that thermal energy may be produced.

The reflective facets may have mirrored surfaces or alternatively their surfaces can be the polished surface of the high RI material from which the coupling elements and light guides are made. In this case the angle of the reflective facet must be capable of supporting Total Internal Reflection. As well as the slope of the reflective facets being critical they may also have a slightly concave shape (outward curving arc as shown in FIGS. 2 and 6) such that when the array goes off axis, incident ray angles entering the light guide maintain a manageable angular range and rays from the first coupling element always pass unimpeded over or under the second coupling element.

The shape of the primary concentrators may be square, rectangular or hexagonal but preferably also allows for the parallelogram shape (illustrated in FIG. 6) which means adjoining edges are In continuous alignment. This is easier to manufacture and where upwardly curved, convex lenses are used, less dust is trapped and the surface is easier to wash. In some embodiments the primary concentrator layer will have a flat top surface which lowers dust adhesion and lowers reflective losses. Lenses and waveguides could be made from molded glass or optical grade plastic, or similar, of high reflective index (n=1.5 or higher).

The size of the arrays varies depending on the desired module profile. The lower the profile height, the cheaper the module is to manufacture and Install on tracking machines. However profile height is correlated to potential array length and width so there is a tradeoff between compact module profile and its potential area. Taller profiles can incorporate higher f-number lenses (pointier light cones) and so a better concentration ratio, but angular acceptance is diminished. Tall modules will be bulkier to install and transport.

Embodiments of the present invention offer a unique combination of a low profile, large area module, with high concentration ratio and/or very high angular acceptance.

Sizes of arrays for this concentrator could be 200 mm-800 mm array widths (referring to the horizontal distance light travels across the array) by as long as is desired. Where an additional array is positioned opposite the first, with rays propagated in the opposite direction so that all light is received at a central line of multi-junction cells, the module sizes could be up to 1600 mm wide by more than 2000 mm long. Module lengths could be customized to customer preferences.

Module profiles could be as low as 10 mm thick, where micro lenses are used, up to 120 mm thick where the primary concentrator layer and the light guide layer are separated by a large air gap. The planar light guide itself could be from 0.4 mm to 5 mm thick.

This device has a potential concentration ratio of well over 500 to 1 with possible acceptance angles of plus or minus 2 to 7 degrees along one axis (sun elevation) and plus or minus 2 to 3 degrees along the (other) declination axis. This is significantly greater than existing high concentration PV (HCPV) systems.

Figure 11:
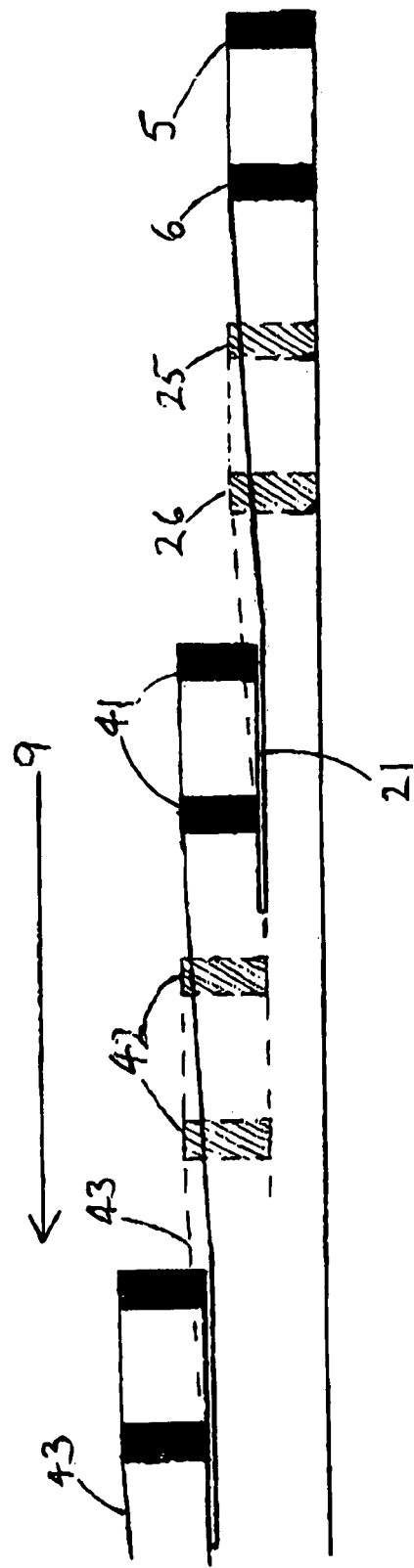
FIG. 11 Top view showing sideways extension of reflectors and tapered propagating channel in a double layered array according to a further embodiment of the invention.

Many dual axis tracking systems are highly accurate along one axis (usually the azimuth) but less so along the other axis. So this HCPV concentrator is uniquely superior for such tracking machines. FIG. 11 shows a further embodiment of the invention wherein the elevation axis angle of acceptance is further increased by extending the reflective facets horizontally.

In FIG. 11 the variously identified components are as follows:

5 first reflective facet. Planar or concave. Polished or mirrored surface.

6 second reflective facet.

9 General direction of light transmission

21 Air gap or low Reflective Index layer.

25 first reflective facet of lower light guide 26 second reflective facet of lower light guide 41 reflective facets of dual element coupler of longitudinally offset dual element coupler of upper light guide 42 reflective facets of dual element coupler of longitudinally offset dual element coupler of lower light guide 43 tapered side wall of light guiding channel FIG. 11 is a top view showing sideways extension of reflectors and tapered propagating channel on a double layer array. Proportions are exaggerated in this view. In this embodiment the light propagation channel is slightly laterally tapered from the second reflective facet of each dual light coupler. This is also well suited to single axis azimuth trackers that have the ability to have their inclination incrementally adjusted. It is particularly suited to tracking system described in granted Australian patent No. 2011244918 to the present inventor.

Embodiments of the invention provide an apparatus capable of producing highly concentrated light, with high tolerance to tracking inaccuracy. The concentrated light is delivered with exceptional uniformity with virtually no loss, to efficient multi-junction cells all on a thin, easily manufactured large area solar array.

In compliance with the statute, the invention has been described in language more or less specific to structural or methodical features. The term "comprises" and its variations, such as "comprising" and "comprised of" is used throughout in an inclusive sense and not to the exclusion of any additional features.

It is to be understood that the invention is not limited to specific features shown or described since the means herein described comprises preferred forms of putting the invention into effect.

The invention is, therefore, claimed in any of its forms or modifications within the proper scope of the appended claims appropriately interpreted by those skilled in the art.

Throughout the specification and claims (if present), unless the context requires otherwise, the term "substantially" or "about" will be understood to not be limited to the value for the range qualified by the terms. The terms "horizontal" and "vertical" are used to describe orientations when the array is in a plane parallel to or at right angles to a flat ground surface. The term "lateral" or "laterally" means 'beside' in the horizontal plane and usually in lines or orientations parallel to the receiving edge. The term adjacent is also referring the horizontal plane. Upper and lower is also in relation to the flat ground. The term downstream means closer to the receiving cell, approaching generally perpendicularly.

Any embodiment of the invention is meant to be illustrative only and is not meant to be limiting to the invention.

Therefore, it should be appreciated that various other changes and modifications can be made to any embodiment described without departing from the spirit and scope of the invention.

Throughout the description and claims of this specification the singular encompasses the plural unless the context otherwise requires. In particular, where the indefinite article is used, the specification is to be understood as contemplating plurality as well as singularity, unless the context requires otherwise.

Features, integers or characteristics described in conjunction with a particular aspect, embodiment or example of the invention are to be understood to be applicable to any other aspect, embodiment or example described herein unless incompatible therewith:

The invention claimed is:

1. A solar concentrator comprising a transparent optical material, the optical material comprising:
   a first light coupling portion having an outer end and an inner end tapered so that it converges from the outer end towards the inner end
   a first facet formed at the outer end and arranged to reflect light along the first light coupling portion;
   a first primary concentrator element arranged to focus light onto the first facet;
   a second light coupling portion having an outer end and an inner end tapered so that it converges from the outer end towards the inner end;
   a second facet formed at the outer end of the second light coupling portion and arranged to reflect light along the portion the second facet vertically overlapping the first facet;
   a second primary concentrator element arranged to focus light onto the second facet;
   a common light guide portion in optical communication with the inner ends of the first and second light coupling portions and arranged to transmit the radiation therethrough;
   wherein a greatest vertical thickness of the common light guide portion is less than a sum of the heights of the first and second facets.

2. A solar concentrator according to claim 1 wherein upper surfaces of the first and second light coupling portions and the common light guide portion present a planar surface.

3. A solar concentrator according to claim 1, wherein lower surfaces of the first and second light coupling portions and the common light guide portion present a planar surface.

4. A solar concentrator according to claim 1, wherein the at least one tapered light coupling portion has a lower face upwardly inclined from a lower edge of the first facet to an upper edge of the second facet.

5. A solar concentrator according to claim 1, wherein the at least one tapered light coupling portion has an upper face downwardly inclined from proximal an upper edge of the first facet to a lower edge of the second facet.

6. A solar concentrator according to claim 1 wherein reflective surfaces of the facets are planar.

7. A solar concentrator according to claim 1, wherein reflective surfaces of the facets are concave.

8. A solar concentrator according to claim 1 further including a layer of low reflective index between the first light coupling portion and the second light coupling portion wherein the layer is of sufficiently low refractive index compared to material of each of said coupling portions to support total internal reflection of light from the facets thereof within said coupling portions.

9. A solar concentrator according to claim 8, wherein the layer comprises an air gap.

10. A solar concentrator according to claim 8, wherein the first light coupling portion and the second light coupling portion are vertically separate by the layer of low refractive index.

11. A solar concentrator according to claim 8, wherein first light coupling portion is located lower than the second light coupling portion and wherein facets of the first light coupling portion extend laterally outward beneath the second light coupling portion.

12. A solar concentrator assembly comprising an outer end and an inner receiving end and comprising a plurality of solar concentrators, wherein adjacent solar concentrators are offset laterally and longitudinally from each other and wherein facets of each of the solar concentrators are in optical communication with a receiving end of the assembly.

13. A solar concentrator assembly according to claim 12, wherein respective solar concentrators for each of the facets describe a parallelogram configuration.

14. A solar concentrator assembly according to claim 12, wherein respective solar concentrators for each of the facets describe square or rectangular configurations.

15. A solar concentrator assembly according to claim 14, wherein the solar concentrators are grouped into a number of rectangular arrays wherein each array is offset from an adjacent array.

16. A solar concentrator assembly comprising first and second columns of solar concentrators, wherein ends of common light guide portions of the solar concentrators of the first column are located opposite ends of common light guide portions of the solar concentrators of the second column.

* * * * *